United States Patent
Daigle et al.

(10) Patent No.: US 8,730,404 B2
(45) Date of Patent: May 20, 2014

(54) PROVIDING A RESET MECHANISM FOR A LATCH CIRCUIT

(75) Inventors: Clayton Daigle, Austin, TX (US); Abdulkerim L. Coban, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 133 days.

(21) Appl. No.: 13/484,475

(22) Filed: May 31, 2012

(65) Prior Publication Data
US 2013/0321709 A1 Dec. 5, 2013

(51) Int. Cl.
*H04N 5/50* (2006.01)

(52) U.S. Cl.
USPC ........... 348/731; 348/722; 348/725; 348/729; 348/730; 348/732; 348/733; 348/705; 348/706; 348/711; 348/571; 348/572; 348/307; 348/308; 348/138; 348/835; 327/142; 327/115; 327/117; 327/118; 327/144; 327/197; 327/199; 327/201; 327/202; 327/203; 327/211; 327/212; 327/316; 327/323; 327/334; 327/345; 327/375; 327/376; 327/377

(58) Field of Classification Search
USPC ......... 348/731, 723, 725, 730, 732, 733, 705, 348/706, 835, 571, 572, 307, 308; 327/142, 327/115, 117, 118, 144, 197, 199, 201, 202, 327/203, 211, 212, 316, 323, 334, 345, 375, 327/376, 377
See application file for complete search history.

(56) References Cited

U.S. PATENT DOCUMENTS

| | | | | |
|---|---|---|---|---|
| 5,055,709 | A * | 10/1991 | Smith | 327/203 |
| 5,173,626 | A * | 12/1992 | Kudou et al. | 327/211 |
| 5,825,205 | A * | 10/1998 | Ohtsuka | 326/81 |
| 5,900,760 | A * | 5/1999 | Lee | 327/202 |
| 6,512,406 | B1 * | 1/2003 | Dike | 327/200 |
| 6,714,060 | B2 * | 3/2004 | Araki | 327/202 |
| 6,888,580 | B2 * | 5/2005 | Dujmenovic | 348/731 |
| 7,161,395 | B2 * | 1/2007 | Xie | 327/117 |
| 7,218,160 | B2 * | 5/2007 | Wada et al. | 327/200 |
| 7,394,052 | B2 * | 7/2008 | Fujii et al. | 250/208.1 |
| 7,425,995 | B2 * | 9/2008 | Johnson | 348/725 |
| 7,719,337 | B2 * | 5/2010 | Uemura et al. | 327/218 |
| 7,928,878 | B1 | 4/2011 | Coban et al. | |
| 8,027,394 | B2 | 9/2011 | Nicolas | |

(Continued)

OTHER PUBLICATIONS

Silicon Labs, "Si2176, Worldwide Hybrid TV Tuner IC with Analog Demodulator," Sep. 20, 2011, 2 pages.

*Primary Examiner* — Jefferey Harold
*Assistant Examiner* — Mustafizur Rahman
(74) *Attorney, Agent, or Firm* — Trop, Pruner & Hu, P.C.

(57) ABSTRACT

In an embodiment, the present invention includes a latch circuit having a first input to receive a data signal and a second input to receive a clock signal. This latch circuit may have a first pair of transistors including a first transistor gated by the data signal and a second transistor gated by an inverted data signal and a second pair of transistors including third and fourth transistors gated by the clock signal. The first transistor may be coupled to the third transistor at a first inter-latch node and the second transistor coupled to the fourth transistor at a second inter-latch node. A reset circuit may be coupled to the latch circuit to maintain the first and second inter-latch nodes at a predetermined voltage level when the clock signal is inactive.

21 Claims, 10 Drawing Sheets

(56) References Cited

U.S. PATENT DOCUMENTS

| | | | |
|---|---|---|---|
| 8,212,943 B2* | 7/2012 | Wang et al. | 348/731 |
| 8,395,932 B2* | 3/2013 | Tomita et al. | 365/154 |
| 8,471,618 B2* | 6/2013 | Chien et al. | 327/208 |
| 2002/0118308 A1* | 8/2002 | Dujmenovic | 348/731 |
| 2003/0030878 A1* | 2/2003 | Jong et al. | 359/189 |
| 2004/0027184 A1* | 2/2004 | Araki | 327/203 |
| 2005/0117071 A1* | 6/2005 | Johnson | 348/729 |
| 2005/0285638 A1* | 12/2005 | Xie | 327/117 |
| 2008/0055487 A1* | 3/2008 | Chang | 348/726 |
| 2008/0100755 A1* | 5/2008 | Wang et al. | 348/731 |
| 2011/0248760 A1* | 10/2011 | Chien et al. | 327/211 |
| 2011/0260764 A1* | 10/2011 | Kitahara et al. | 327/202 |
| 2011/0285443 A1* | 11/2011 | Suzawa | 327/199 |
| 2012/0025805 A1* | 2/2012 | Matsushita et al. | 324/76.11 |

\* cited by examiner

PROVIDING A RESET MECHANISM FOR A LATCH CIRCUIT

BACKGROUND

Latch circuits are common electrical circuits used in many different types of situations. Data latches are used commonly to latch or transfer a received data signal to an output of the latch as timed by a clock signal. Data latches are commonly used in logic circuitry such as flip-flops that can be of many different types of latch configurations including D-type latches and so forth.

Oftentimes a latch circuit is used in high speed switching circuitry. When a clocked latch circuit is used in high speed mixed signal circuitry, the delay of the latch can affect performance, especially if the delay is variable from one clock period to the next. Circuits operate to latch a data signal received at an input through the circuit when the clock signal is active. However, when the clock signal is inactive, a point within the circuit may be at a floating voltage, dependent upon the state of the input circuit. This floating node can be susceptible to coupling from other nodes of the circuit, such as the input, the clock signal and so forth. As a result of this floating node, there can be a data dependent delay before a correct output value is present at the output of the latch circuit. While in many circuits, this delay does not affect proper circuit operation, in certain high speeds circuits, such as when the data latch is used within a data converter, performance can be impacted. Also, if the delay is dependent on the data sequence being passed, the latch can cause noise and other distortion, as a delay in data transitions may cause a signal dependent error signal to be generated.

SUMMARY OF THE INVENTION

According to one aspect, the present invention is directed to an apparatus including a latch circuit having a first input to receive a data signal and a second input to receive a clock signal. This latch circuit may include a first pair of transistors including a first transistor gated by the data signal and a second transistor gated by an inverted data signal and a second pair of transistors including third and fourth transistors gated by the clock signal. The first transistor may be coupled to the third transistor at a first inter-latch node and the second transistor coupled to the fourth transistor at a second inter-latch node. The apparatus may further include a reset circuit to maintain the first and second inter-latch nodes at a predetermined voltage level when the clock signal is inactive.

In one embodiment, the reset circuit includes a first switch and a second switch coupled between the first and second inter-latch nodes, where the first switch and the second switch are coupled to receive an inverted clock signal, and the first and second switches turn on when the inverted clock signal is active and cause the first and second inter-latch nodes to couple to the predetermined voltage level. When the first and second switches are on, the first and second intra-latch nodes are prevented from being at a floating voltage.

Another aspect of the present invention is directed to a method including receiving a data signal via an input node of a latch circuit, outputting the data signal from an output node of the latch circuit when a clock signal is in an active state, and resetting an inter-latch node coupled between the input and nodes of the latch circuit when the clock signal is in an inactive state. The data signal may be received at a first transistor of the latch circuit and coupled through the inter-latch node and to the output node via a second transistor when the clock signal is in the active state.

Another aspect of the present invention is directed to a system with a television tuner to receive and process a radio frequency (RF) signal. The tuner may include a mixer to downconvert the RF signal to a second frequency signal, and an analog-to-digital converter (ADC) to receive and digitize the second frequency signal. In an embodiment, the ADC may include a combiner to combine the second frequency signal with an error signal to obtain a combined signal, a loop filter to filter the combined signal, a quantizer to generate and output a digitized signal from the combined signal, a shaper circuit coupled to the quantizer to shape the digitized signal, and a feedback digital-to-analog converter (DAC) coupled to receive the shaped digitized signal and generate the error signal. In turn, this feedback DAC can include latch circuits each including a reset circuit to maintain an inter-latch node of the latch circuit at a predetermined voltage level when a clock signal provided to the latch circuit is inactive.

DETAILED DESCRIPTION

In various embodiments, a latch circuit can be controlled to remove a data dependent delay associated with the circuit's operation at high speeds. This can be realized by preventing one or more floating nodes in the circuit. More specifically, as will be described herein a reset circuit can be provided in connection with a data latch to maintain a circuit point such as an inter-latch node at a predetermined voltage level when a clock signal provided to the latch circuit is at an inactive state. In this way, by maintaining this inter-latch node at a predetermined voltage level, the data dependent delay is avoided. In this way, circuits including such data latches can have enhanced performance and speed of operation, and also minimize any asymmetries with regard to turn on times and turn off times of the latch, preventing non-linear distortion of a circuit including this latch circuit.

Figure 1:
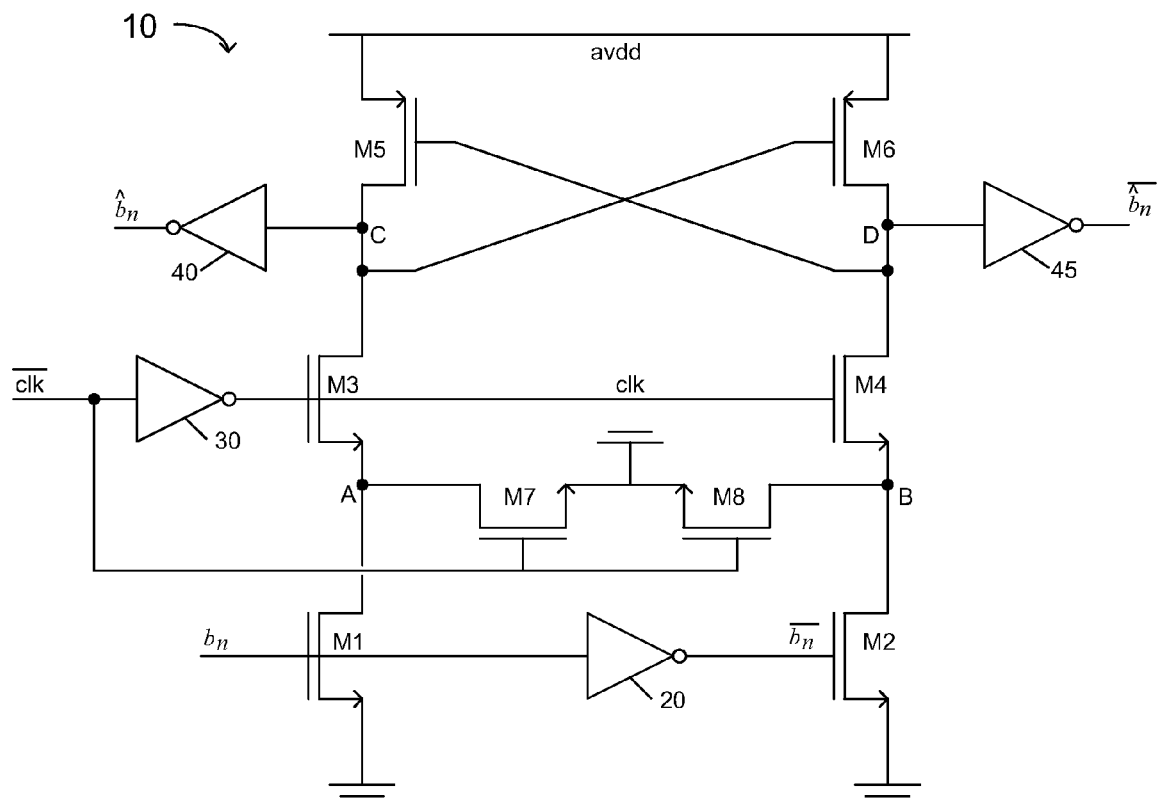
FIG. 1 is a schematic diagram of a latch circuit in accordance with an embodiment of the present invention.

Referring now to FIG. 1, shown is a schematic diagram of a latch circuit in accordance with an embodiment of the present invention. As shown in FIG. 1, latch circuit 10 may be a data latch that can be used in various circuits. As one example that will be described further herein, latch 10 can be used within a feedback digital-to-analog converter (DAC) of a delta-sigma analog-to-digital converter (ADC).

As seen, an incoming signal $b_n$ may be provided to a first metal oxide semiconductor field effect transistor (MOSFET) M1, more specifically to a gate terminal of transistor M1. In turn, an inverted version of this signal, via inverter 20, namely $\overline{b_n}$, can be coupled to a gate terminal of a second MOSFET M2. As seen, these input MOSFETs are coupled to receive the input data signal (or its inverted version) via gate terminals, have source terminals commonly coupled to a reference voltage (e.g., a ground voltage) via a reference voltage node, and drain terminals coupled to inter-latch nodes A and B, respectively.

As further seen, an incoming clock signal, CLK, is output from an inverter 30 that receives an inverted clock signal $\overline{CLK}$. This clock signal from the output of inverter 30 couples to the gate terminals of MOSFETs M3 and M4 that have corresponding source terminals coupled to inter-latch nodes A and B and drain terminals coupled to latch output nodes C and D, respectively. In turn, these latch output nodes may further couple to a respective one of a pair of inverters 40 and 45 to thus output signals $\hat{b}_n$ and $\overline{\hat{b}_n}$.

As further seen, a pair of MOSFETs M5 and M6 may be cross coupled at their gate terminals to nodes D and C, respectively. Furthermore, MOSFETs M5 and M6 may have source terminals coupled to a supply voltage and drain terminals commonly coupled to nodes C and D, respectively. Note that in the implementation of FIG. 1, MOSFETs M1-M4 are NMOS devices while MOSFETs M5 and M6 are PMOS devices.

Using data latch 10, when a positive input signal $b_n$ and an active clock signal CLK are present, after a delay this same value will be output from inverter 40 as $\hat{b}_n$ and its inverted version via inverter 45 as $\overline{\hat{b}_n}$.

To avoid an issue with a floating node on at least one of inter-latch nodes A and B when the clock signal is low, embodiments may provide reset circuitry to hold these inter-latch nodes at a predetermined level when the clock signal is in an inactive (e.g., low) state. By maintaining these nodes at a known state, timing performance of the latch may be improved, in turn improving the overall operation of an ADC.

In the embodiment of FIG. 1, reset circuitry may be realized by providing an additional pair of MOSFETs M7 and M8 between the inter-latch nodes A and B. More specifically as seen in FIG. 1, these MOSFETs may be configured to receive an inverted version of the clock (namely $\overline{CLK}$) at their gate terminals. In turn, the source terminals of these transistors may be coupled to a reset node having a predetermined voltage which in an embodiment can be at a ground voltage level. Similarly, each MOSFET M7 and M8 may have a drain terminal coupled to a corresponding one of inter-latch nodes A and B. Although shown with this particular implementation in the embodiment of FIG. 1, understand the scope of the present invention is not limited in this regard. For example, other variations of a data latch are possible (e.g., with different polarity transistors), and understand also that the reset circuit can be differently configured in some implementations. For example, in other implementation, rather than providing two switches, a single switch can be coupled between the inter-notch nodes. Still other designs for the reset circuit are possible, such as providing a reset circuit that uses a pulsed reset that is not derived from a clock input of the latch. For example, the reset signal (provided to gates of MOSFETs M7 and M8) may be provided as a separate input which is pulsed while the clock is inactive. Even a short duration reset pulse just before a rising clock edge can adequately flush the memory of the previous sample or any other corruption on nodes A and B. As such, a reset signal may be applied at any time while the clock signal is inactive.

This reset circuitry may thus resolve a possible delay that could occur in the latch circuit. Delay in a latch is derived in part from the speed of its internal regeneration circuitry (regeneration is implemented in FIG. 1 using cross-coupled devices M5 and M6). Any regeneration circuit is sensitive to its initial state. The initial state of the latch in FIG. 1 is determined by nodes A and B (as well as C and D, but C and D are not floating). So if nodes A and B are disturbed, the initial state of the regeneration circuitry is different, which alters the trajectory of the internal node voltages enough that a timing error is observed. Regeneration starts when the clock goes active, but the time it takes to complete depends on the initial values of nodes A and B (i.e., its initial state).

Figure 2:
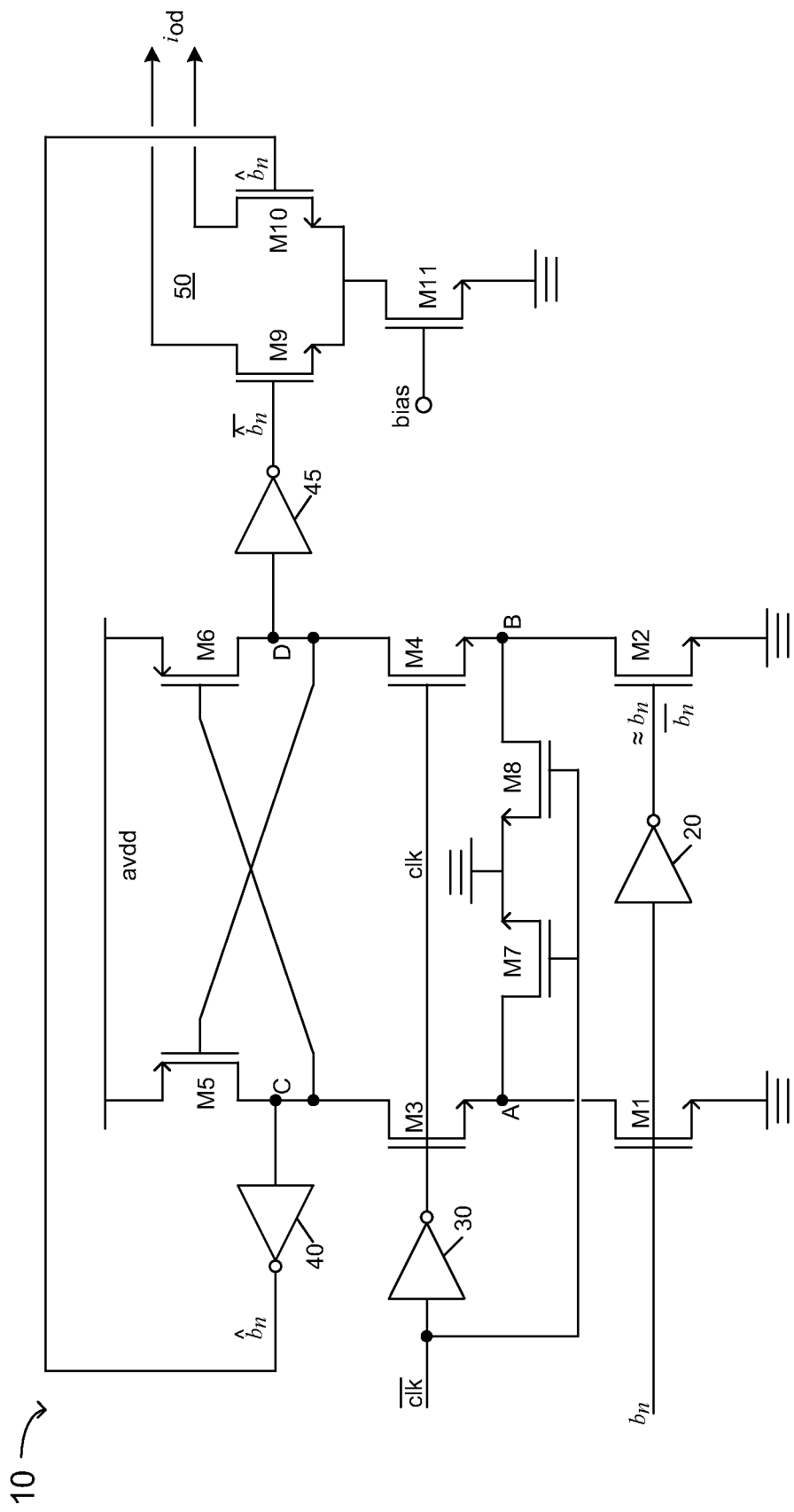
FIG. 2 is a schematic diagram of coupling of a latch circuit to a switching cell in accordance with an embodiment of the present invention.

Referring now to FIG. 2, shown is a schematic diagram of coupling of a latch circuit in accordance with an embodiment of the present invention to a switching cell. As seen in FIG. 2, latch circuit 10 may be configured the same as in FIG. 1. Here, the outputs of latch circuit 10 may be coupled to a switching cell 50. As seen switching cell 50 may be formed of a pair of MOSFETs M9 and M10 having gate terminals coupled to receive the differential output of latch circuit 10 and configured to provide a differential current $I_{od}$ via their drain terminals. As seen, the source terminals of MOSFETs M9 and M10 are commonly coupled to a drain terminal of a control MOSFET M11 having a source terminal coupled to a reference voltage (e.g., ground) and a gate terminal coupled to a bias voltage. This switching cell may be part of a multi-bit feedback DAC of an ADC. By providing a reset circuit associated with latch circuit 10 as described herein, the latch rise and fall times may be substantially symmetrical. As a result, there may be reduced error currents during transitions.

Figure 3A:
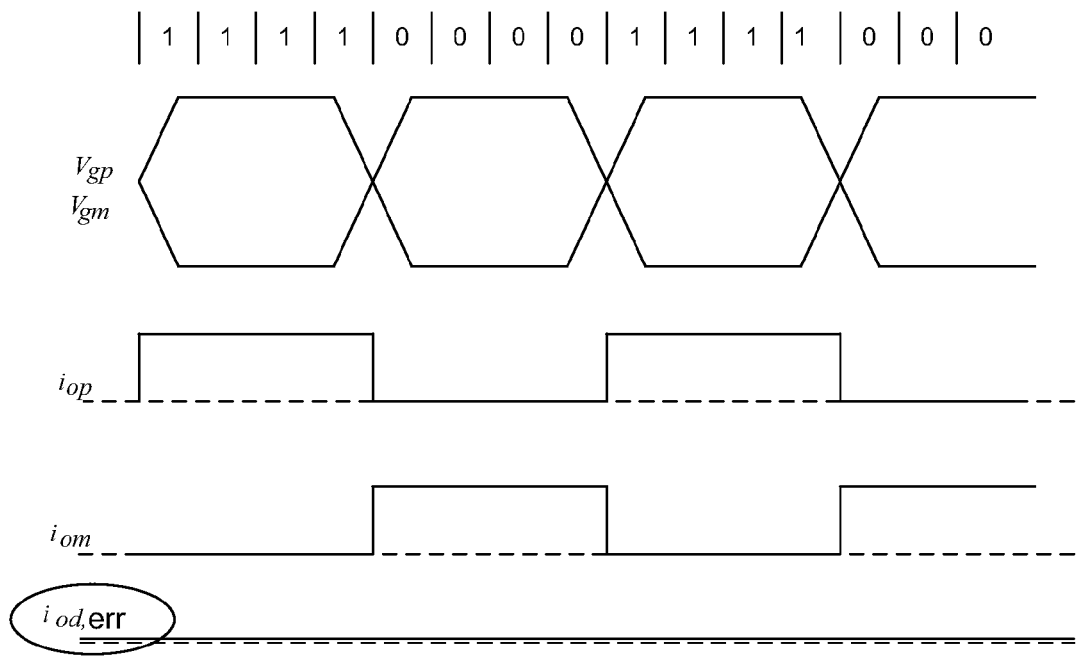
FIGS. 3A and 3B are graphical illustrations of transitions in a combined latch circuit and switching cell in accordance with one embodiment of the present invention.
Figure 3B:
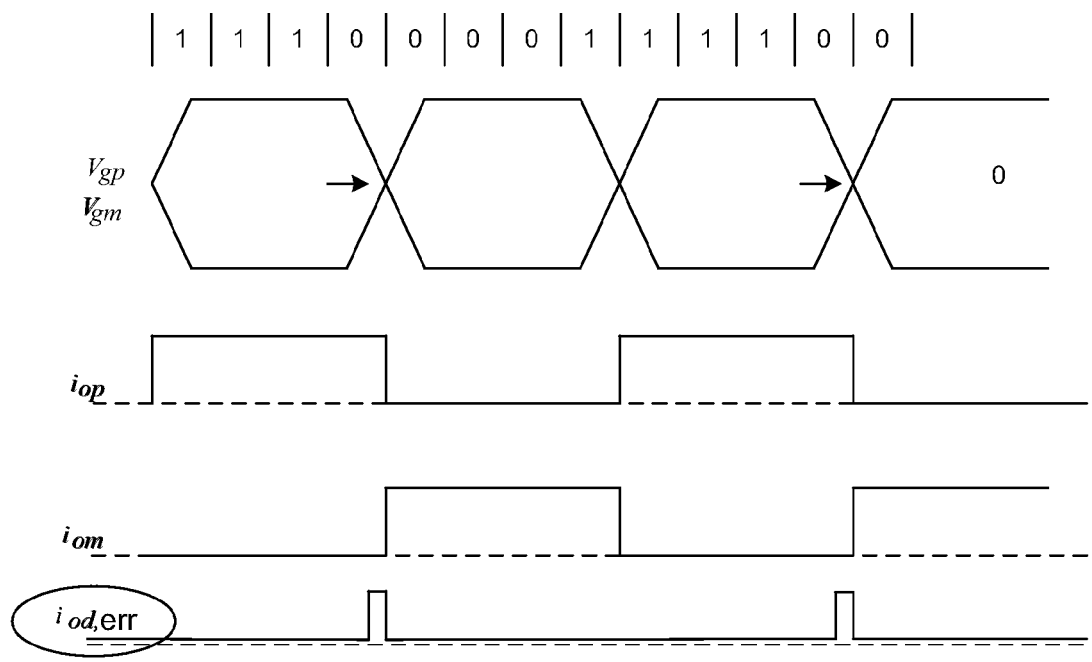

Referring now to FIGS. 3A and 3B, shown are graphical illustrations of transitions in a combined latch circuit and switching cell. FIG. 3A presents input voltages to the switching cell (Vgp and Vgn), and the corresponding output currents from the switching cell ($i_{op}$ and $i_{on}$). As seen, using an embodiment of the present invention as in FIG. 3A, no error current ($i_{od}$, err) results, as the reset circuit maintains nodes A and B at a predetermined voltage level when the CLK signal is inactive. In contrast, as seen in FIG. 3B, without a reset circuit, an error signal may exist since the latch circuit may have an imbalance. That is, since transitions from a logic high state to a logic low state are late, charge can be taken from the negative output and provided to the positive output, thus causing the error current to appear directly at the output of the differential current signal. Note that this imbalance can be, for example, a parasitic capacitance of one of the input transistors (e.g., M1 or M2).

Figure 4:
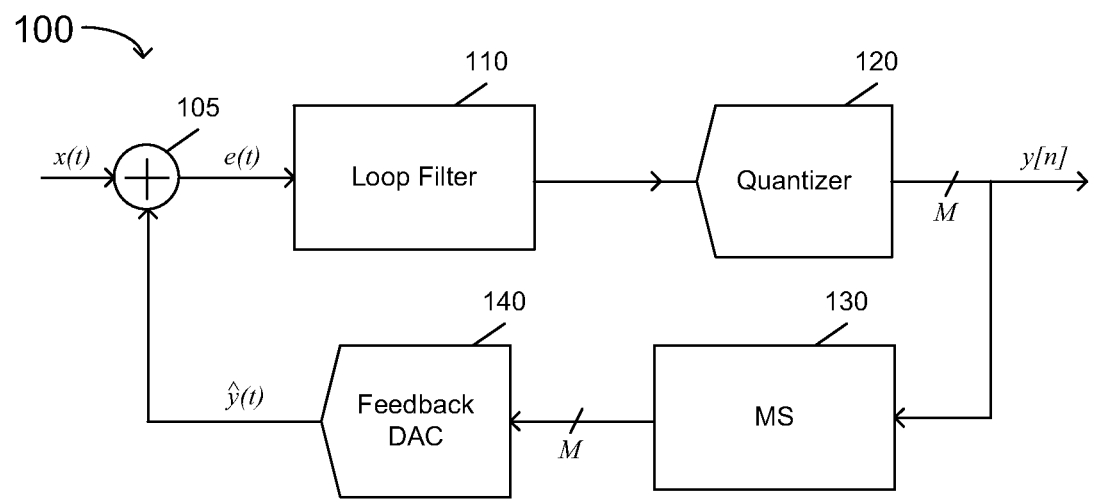
FIG. 4 is a block diagram of a delta-sigma ADC in accordance with an embodiment of the present invention.

Referring now to FIG. 4, shown is a block diagram of a delta-sigma ADC in accordance with an embodiment of the present invention. As shown in FIG. 4, ADC 100 may be of delta-sigma design and can be used to receive an incoming analog signal x(t) and generate a resulting digitized version y[n] that is a multi-bit output signal corresponding to the analog input signal. In various embodiments, this multi-bit signal may be of M bits, where M can vary between 2 and 128 in different implementations. Here it is assumed that M is thermometer decoded. Typically a binary converted version of the quantizer output is taken as the output of the delta-sigma ADC.

As seen, ADC 100 is configured with a feedback loop such that quantized version of the input signal ŷ(t) is coupled to a summer 105 where this feedback value is subtracted from the input signal x(t). The resulting error signal e(t) may be provided to a loop filter 110 which in an embodiment can be implemented via a continuous time filter. The resulting filtered output is provided to a quantizer 120, e.g., implemented as an M-bit ADC, which thus generates the quantized M-bit output y[n]. In addition, this output signal is provided to a mismatch shaping (MS) circuit 130, which performs mismatch shaping. The resulting shaped M-bit signal is provided to a feedback DAC 140 which in turn converts this multi-bit signal into an analog signal for feedback to summer 105 as the error signal ŷ(t). Although shown at this high level in the embodiment of FIG. 4, understand the scope of the present invention is not limited in this regard.

Note that feedback DAC 140 may be carefully designed as its errors can be indistinguishable from the input signal. As such, the DAC performance may be designed to be better than the overall ADC performance. In some embodiments, feedback DAC 140 can be configured as an array of matched elements (e.g., matched current sources, matched resistors, capacitors, or so forth). Mismatch among such elements may cause nonlinear distortion. Accordingly MS circuit 130 can be used to shuffle the selection of DAC elements on each sample so that nonlinear distortion can be suppressed, thus improving the overall ADC performance.

Figure 5:
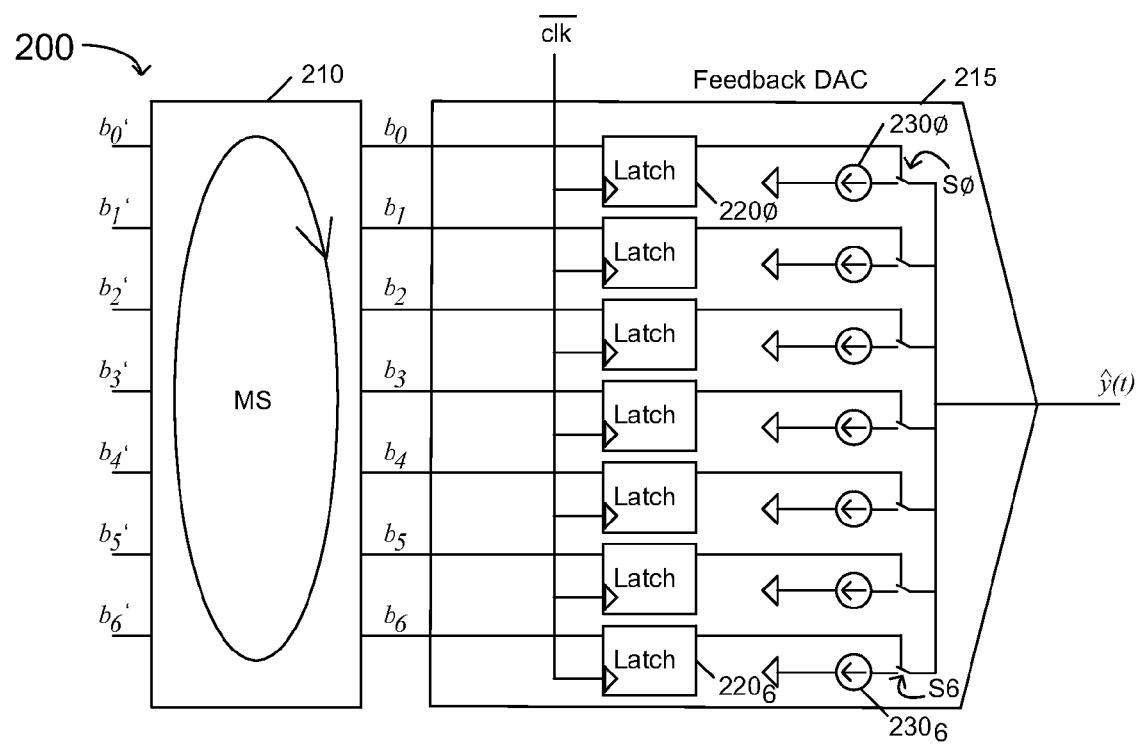
FIG. 5 is a block diagram of further details of a mismatch shaper and a feedback DAC in accordance with an embodiment of the present invention.

Referring now to FIG. 5, shown is a block diagram of further details of a mismatch shaper and a feedback DAC in accordance with an embodiment of the present invention. As shown in FIG. 5, circuit 200 includes a mismatch shaper 210 coupled to receive an M-bit output, e.g., from a quantizer, namely the ADC quantizer. In the example shown, a 7-bit signal ($b'_0$-$b'_6$) is present. However, understand the scope of the present invention is not limited in this regard and embodiments may provide for different widths of information. In general, shaper 210 acts to shuffle the input signals received and provide them to a corresponding one of a plurality of output paths as shuffled signals $b_0$-$b_6$. In an embodiment, the multi-bit input can be thermometer-coded bits received from a quantizer. Note that shaper circuit 210 can operate in accordance with one of various shaping algorithms to shuffle the bits to different output ports. Note that these different algorithms thus increase the switching activity in feedback DAC 215 to attempt to shape noise and other distortions such that nonlinear distortion can be suppressed.

As further seen in FIG. 5, feedback DAC 215 may be configured to receive these shuffled signals $\bar{b}_0$-$\bar{b}_6$ and provide each of the bits to one of a plurality of latches 220₀-220₆. Each such latch may include a reset circuit such as in accordance with FIG. 1 above. In addition, each latch may be configured to receive a $\overline{CLK}$ signal. The resulting outputs of latches 220 may be selectively coupled through a corresponding one of a plurality of switches $S_0$-$S_6$. As such when the switch is closed (when the latch output high state) the corresponding current source 230₀-230₆, each of which can be implemented by a differential transistor pair, may couple to an output summation line to thus generate an analog feedback signal ŷ(t). Accordingly latches 220 operate to synchronize the digital data so that feedback DAC 210 is updated on precise clock edges. Note that FIG. 5 is drawn with a single-ended latch for simplicity, but a more common latch and switched current source configuration is shown in FIG. 2.

Note that while described herein as being used within a delta-sigma ADC using multi-bit feedback and dynamic element matching, understand the scope of the present invention is not limited in this regard. That is, embodiments can be used in many different types of circuits using a data latch. As one such example, embodiments can be implemented in a delta-sigma DAC that uses a multi-bit DAC core along with a mismatch shaper.

Although a latch circuit 10 of FIG. 1 is one embodiment of a latch circuit with which a reset circuit can be used, as mentioned above other latch topologies are certainly possible.

Figure 6:
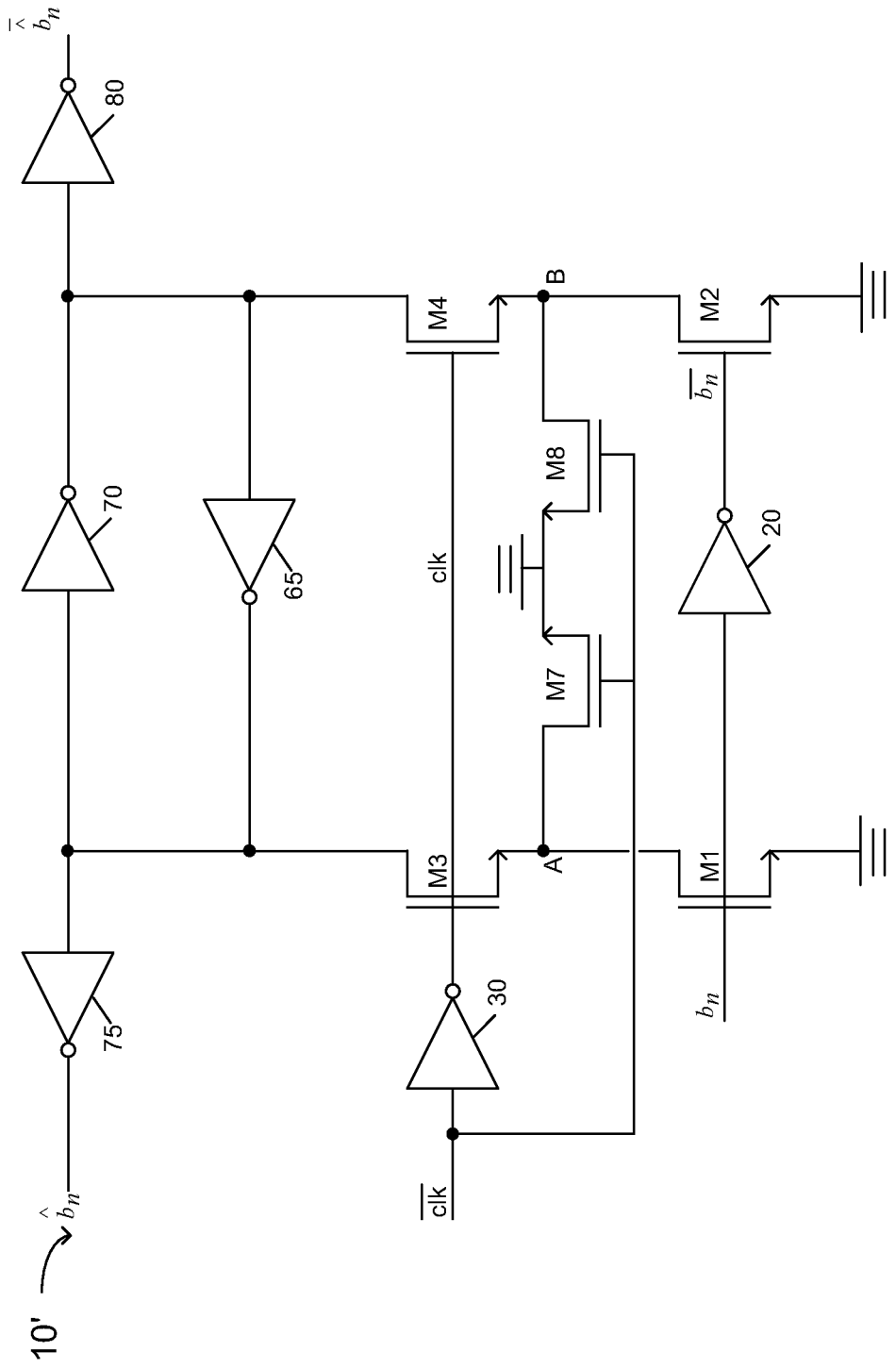
FIG. 6 is a schematic diagram of a latch circuit in accordance with another embodiment of the present invention.

Referring now to FIG. 6, shown is a schematic diagram of a latch circuit in accordance with an embodiment of the present invention. As shown in FIG. 6, latch circuit 10' may generally include the same input and clocking circuitry as that of latch circuit 10 of FIG. 1. However, note that the output stage of latch circuit 10' differs. Specifically, the output of MOSFETs M3 and M4 may couple to an inverter structure formed of a plurality of inverters. Specifically, the drain terminals of MOSFETs M3 and M4 coupled to a first inverter 65 having an input coupled to the drain terminal of MOSFET M4 and an output coupled to the drain terminal of MOSFET M3, and a second inverter 70 oppositely coupled to these drain terminals in parallel. In addition, output inverters 75 and 80 may couple to the input and output, respectively of inverter 70 (and the output and input of inverter 65, respectively) to thus provide the output data signals $\hat{b}_n$ and $\hat{\bar{b}}_n$.

Figure 7:
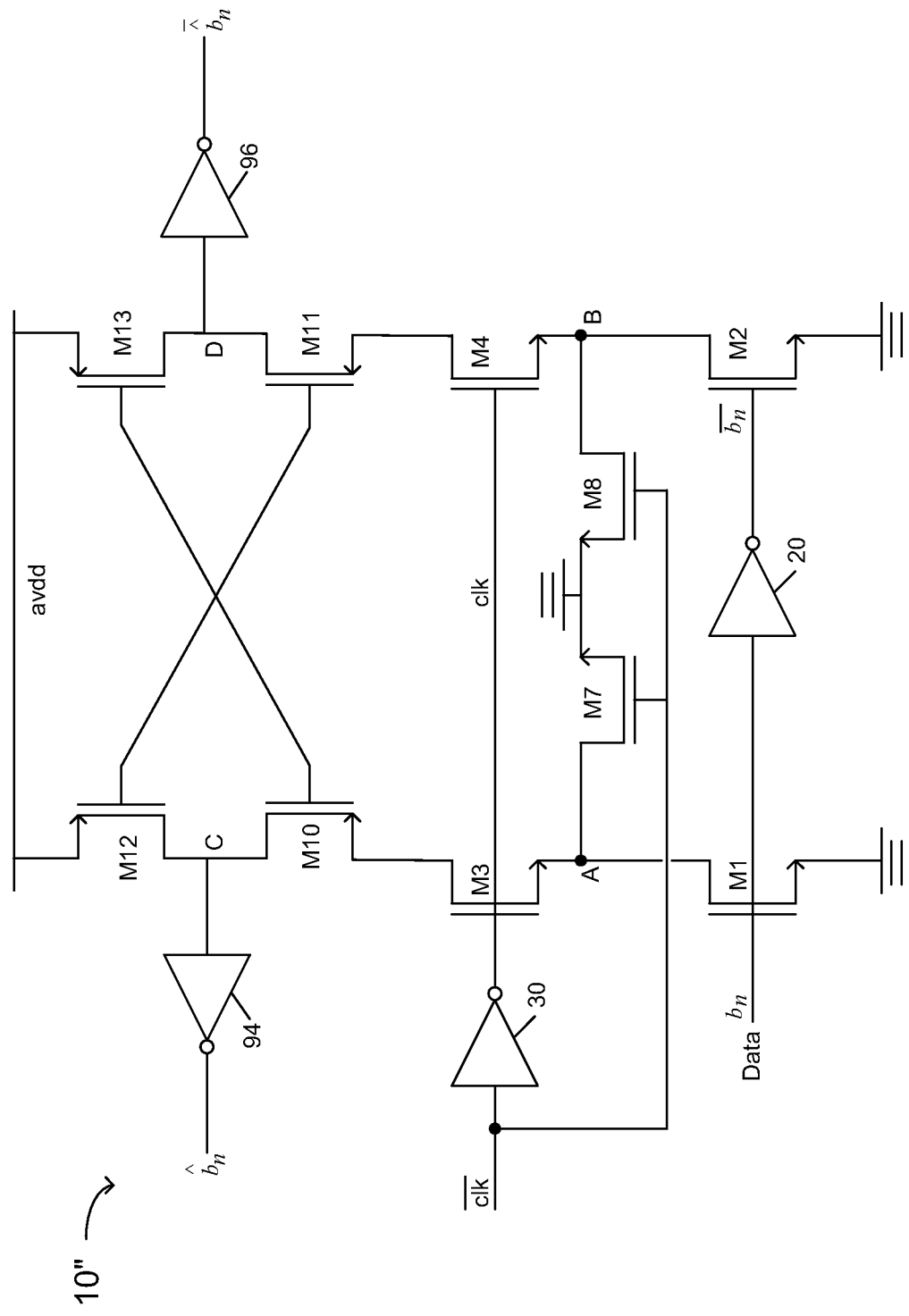
FIG. 7 is a schematic diagram of a latch circuit in accordance with yet another embodiment of the present invention.

Referring now to FIG. 7, shown is a schematic diagram of yet another latch in accordance with an embodiment of the present invention. As shown in FIG. 7, the output circuitry of this latch circuit 10" may include a first pair of output transistors M10 and M12 having commonly coupled drain terminals to output the data signal $\hat{b}_n$ through an inverter 94 and a second pair of MOSFETs M11 and M13 similarly having commonly coupled drain terminals to provide the inverted data signal $\hat{\bar{b}}_n$ to an inverter 96. As seen, each of these pairs of output transistors can have their gate terminals coupled together and cross coupled to the drain terminals of the other pair of output transistors.

Figure 8:
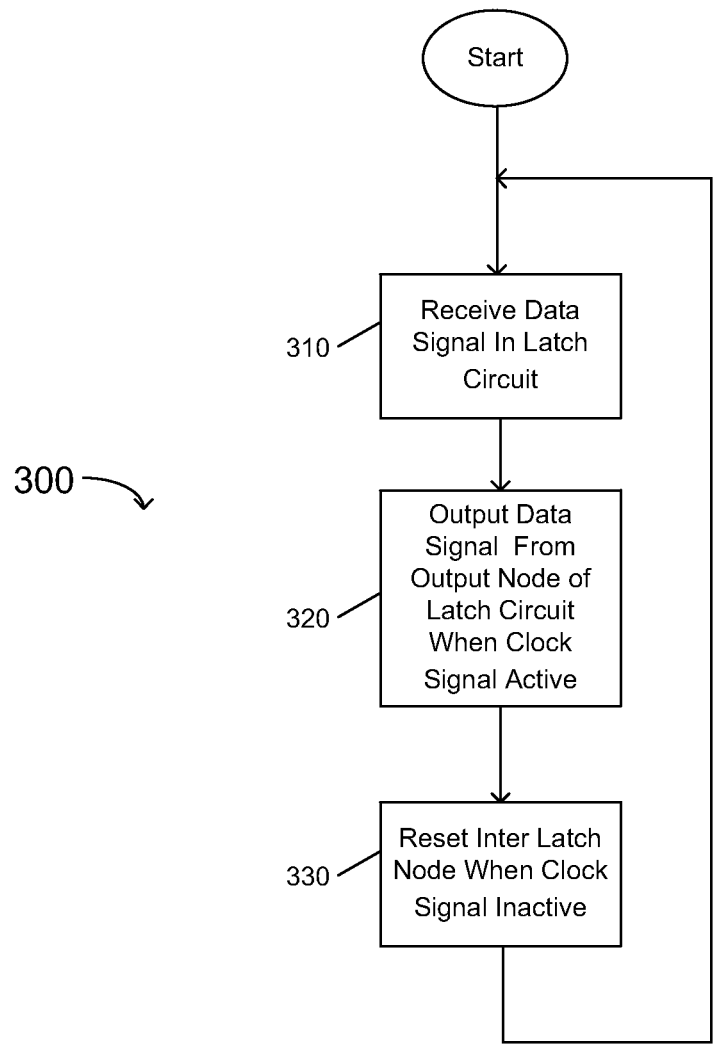
FIG. 8 is a flow diagram of a method of operation in accordance with an embodiment of the present invention.

Referring now to FIG. 8, shown is a flow diagram of a method of operation in accordance with an embodiment of the present invention. As shown in FIG. 8, method 300 may be performed in a latch circuit in accordance with an embodiment of the present invention, such as latch circuit 10 of FIG. 1. Note that while the example of FIG. 1 is a differential latch circuit, understand the scope of the present invention is not limited in this regard and in other embodiments, the latch circuit may be a single-ended latch.

As seen in FIG. 8, method 300 may begin by receiving a data signal in a latch circuit (block 310). Note that for purposes of discussion in FIG. 8, assume that the latch circuit is singled ended such that only a single-ended data signal is received. However understand in other implementations, a differential data signal can be received, e.g., in a differential latch circuit such as that of FIG. 1.

Next, control passes to block 320 where the data signal can be output from an output node of the latch circuit when a clock signal is active. Thus when the CLK signal is in an active high state, the value of the data signal is provided via an output node.

Still referring to FIG. 8, at block 330 an inter-latch node can be reset when a CLK signal enters an inactive (e.g., low) state. This resetting can be performed by triggering a switch coupled to this inter-latch node that causes the node to be at a predetermined voltage. As an example, the switch can be controlled to cause a ground voltage to be coupled to the node to thus maintain this node at a non-floating, ground voltage when the CLK signal is inactive, thus preventing a floating voltage on this node, which could lead to a memory effect in the latch circuit on a next active CLK cycle. As seen the method may iterate during normal operation of the circuit. Note that blocks 310 and 330 may occur at a common phase in some embodiments. Although shown at this high level in the embodiment of FIG. 8, understand the scope of the present invention is not limited in this regard.

Figure 9:
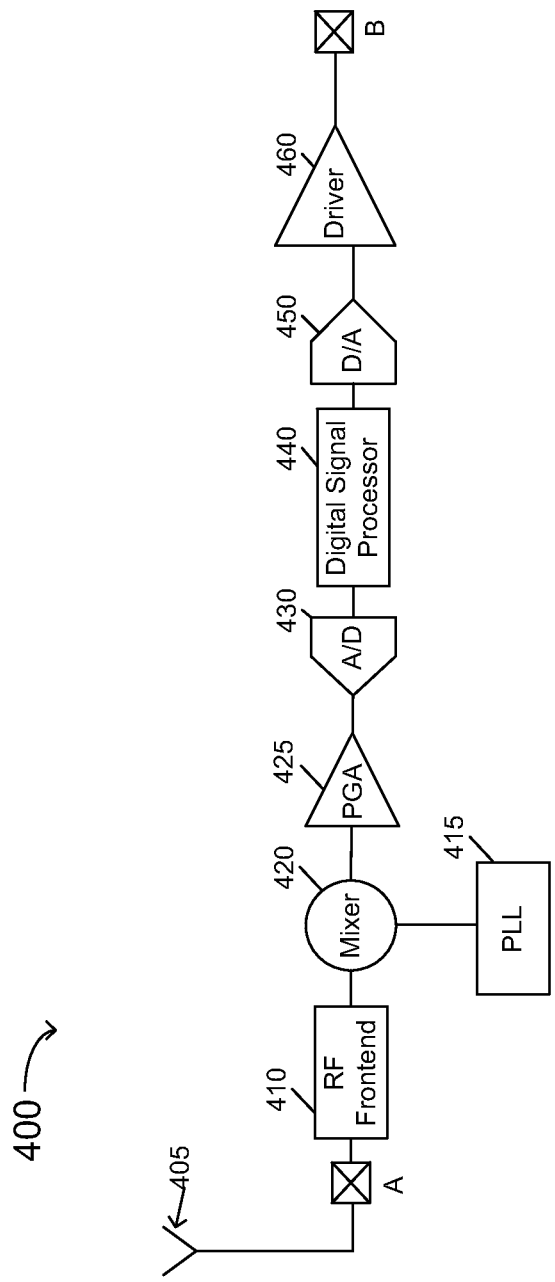
FIG. 9 is a block diagram of a tuner in accordance with an embodiment of the present invention.

Referring now to FIG. 9, shown is a block diagram of a tuner in accordance with an embodiment of the present invention. In the embodiment shown, tuner 400 may be configured to receive a variety of different incoming RF signals. In implementations in which tuner 400 is a television tuner, the incoming RF signal can be one of a variety of world wide terrestrial and cable TV standards including both analog and digital TV-based standards.

As seen in FIG. 9, incoming RF signals may couple through an antenna 405 to tuner 400 which as generally shown is coupled between an input pin A and an output pin B. Of course understand while only these two connections are shown for ease of illustration, understand that many different pins may be provided on the tuner. Furthermore, understand while shown for ease of illustration as receiving a single-ended input, in other embodiments, tuner 400 can handle incoming differential signals. Furthermore, although only a single signal path is shown for ease of illustration, many tuners utilize multiple paths such as for implementing complex signal processing. However for ease of illustration only a single processing path is shown in FIG. 9. In many implementations tuner 400 can be configured on a single semiconductor die such as a complementary metal oxide semiconductor (CMOS) die.

Incoming signals may be provided to an RF front end unit 410 which may generally receive and handle processing of the signals, e.g., via amplifiers or other gain control circuitry. The resulting signals are coupled to a mixer 420 which operates to downconvert the RF signals to lower frequency signals. In various embodiments, tuner 400 can be configured to be a low-IF tuner such that mixer 420 operates to downconvert the RF signal to a low-IF signal. However, understand the scope of the present invention is not limited in this regard. Mixer 420 may downconvert the signal responsive to a local oscillator signal received from a phase lock loop (PLL) 415 which in an embodiment can be implemented via a frequency synthesizer. Although shown as a single-path mixer, understand that in various embodiments this mixer may be a complex mixer. Then amplification of the lower frequency signal may occur in a programmable gain amplifier (PGA) 425. This resulting amplified lower frequency signal is provided to an analog-to-digital converter (ADC) 430 which in an embodiment can be a multi-bit delta-sigma ADC that includes latch circuitry in accordance with an embodiment of the present invention. The digitized low-IF signal generated by ADC 430 may be provided to a digital signal processor (DSP) 440 which may perform various processing, depending upon the type of signal. For an analog TV signal, DSP 440 may perform various operations including demodulation of the signal to thus provide a resulting demodulated signal. Instead for signals generating using digital modulation techniques, the DSP may perform other processing to generate a digital low-IF signal that can be provided to off-chip circuitry, such as a separate digital demodulator. However, understand that in some implementations it is possible to further perform digital demodulation within tuner 400.

Still referring to FIG. 9, after processing, the resulting digital signals may be provided to a digital-to-analog converter (DAC) 450 which thus converts the signal back to an analog signal. For purposes of illustration, assume the processed signal is a demodulated analog TV signal. As seen, the signal is provided to a driver 460, from which it can be output as a CVBS signal via output pin B.

Figure 10:
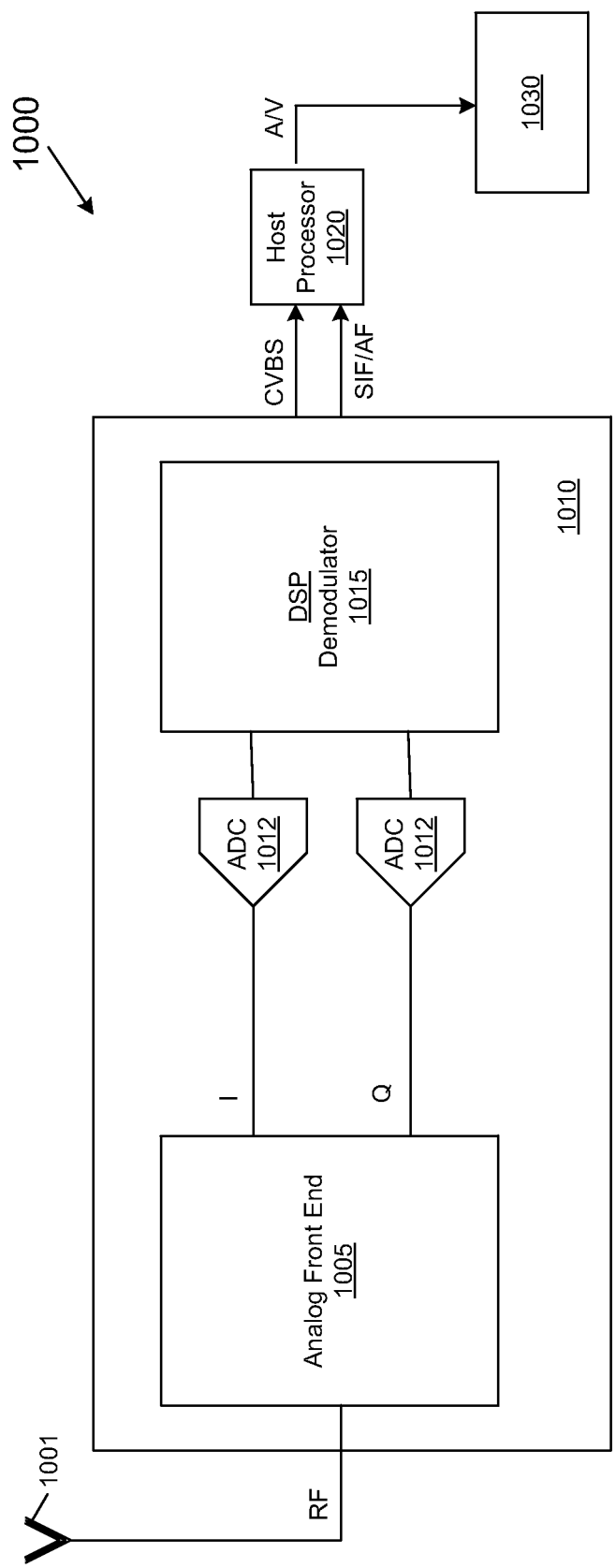
FIG. 10 is a block diagram of a system in accordance with one embodiment of the present invention.

Embodiments may be implemented in many different system types, such as wireless devices, set-top boxes, televisions, and so forth. Some applications may be implemented in a mixed signal circuit that includes both analog and digital circuitry. Referring now to FIG. 10, shown is a block diagram of a system in accordance with one embodiment of the present invention. As shown in FIG. 10, system 1000 may include a television that is coupled to receive a RF signal from an antenna source 1001 such as an over-the-air antenna 1001. However, in other embodiments the original source may be cable distribution, satellite, or other source that is then redistributed through a digital terrestrial network. The incoming RF signal may be provided to a tuner 1010 which may be, in one embodiment a single-chip mixed signal device including both a tuner and an analog demodulator.

More specifically, the incoming RF signal is provided to an analog front end 1005 of the tuner for tuning to a desired signal channel. While the scope of the present invention is not limited in this regard, front end 1005 may include various circuitry. For example, in one embodiment front end 1005 may include a bandpass filter having an output coupled to a low noise amplifier (LNA) to receive and amplify the RF signal. The output of the LNA may be provided to another bandpass filter that in turn is coupled to a mixer. In turn, the mixer downconverts the incoming RF signal to a complex output. This complex output (i.e., I/Q data) may be at IF, low-IF, or zero-IF, in different systems. As shown in FIG. 10, tuner 1005 may be coupled to a demodulator 1010 that includes various circuitry, including an analog front end having analog-to-digital converters (ADCs) 1012 to convert the incoming I/Q data to digital form, to provide a modulated bitstream of a desired signal channel. Note that such ADCs may include reset circuitry in accordance with an embodiment of the present invention. The signal channel information may be provided to a digital signal processor (DSP) 1015 which can perform various digital-based processing operations, including analog demodulation to obtain a CVBS signal and a SIF/AF signal that can be provided to a host processor 1020. Host processor 1020 may further process the information into an audio visual signal that may be provided to a display 1030, such as a computer monitor, flat panel display or other such display.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a latch circuit having a first input to receive a data signal and a second input to receive a clock signal, the latch circuit including a first pair of transistors including a first transistor gated by the data signal and a second transistor gated by an inverted data signal, a second pair of transistors including third and fourth transistors gated by the clock signal, the first transistor coupled to the third transistor at a first inter-latch node and the second transistor coupled to the fourth transistor at a second inter-latch node; and
   a reset circuit to maintain the first and second inter-latch nodes at a predetermined voltage level when the clock signal is inactive.

2. The apparatus of claim 1, wherein the reset circuit includes a first switch and a second switch coupled between the first and second inter-latch nodes.

3. The apparatus of claim 2, wherein the first switch and the second switch are coupled to receive an inverted clock signal.

4. The apparatus of claim 3, wherein the first and second switches turn on when the inverted clock signal is active and cause the first and second inter-latch nodes to couple to the predetermined voltage level.

5. The apparatus of claim 4, wherein when the first and second switches are on, the first and second inter-latch nodes are prevented from being at a floating voltage.

6. The apparatus of claim 3, wherein the first and second switches are off when the inverted clock signal is inactive.

7. The apparatus of claim 2, wherein the first switch and the second switch are coupled to receive a reset signal when the clock signal is inactive.

8. The apparatus of claim 1, wherein the reset circuit is inactive when the clock signal is active, and the reset circuit is active when the clock signal is inactive.

9. The apparatus of claim 1, further comprising a current source coupled to an output of the latch circuit.

10. The apparatus of claim 9, further comprising a mismatch shaper circuit to receive a plurality of bits and to shuffle the plurality of bits and to provide a first of the plurality bits to the latch circuit and to provide others of the plurality of bits to a corresponding one of the plurality of latch circuits each including a reset circuit.

11. A method comprising:
receiving a data signal via an input node of a latch circuit;
outputting the data signal from an output node of the latch circuit when a clock signal is in an active state; and
resetting an inter-latch node coupled between the input node of the latch circuit and the output node of the latch circuit when the clock signal is in an inactive state.

12. The method of claim 11, further comprising receiving the data signal at a first transistor of the latch circuit, and coupling the data signal through the inter-latch node and to the output node via a second transistor when the clock signal is in the active state.

13. The method of claim 12, further comprising receiving an inverted data signal at a third transistor of the latch circuit, and coupling the inverted signal through a second inter-latch node and to a second output node via a fourth transistor when the clock signal is in the active state.

14. The method of claim 11, wherein resetting the inter-latch node includes coupling a predetermined voltage to the inter-latch node when the clock signal is in the inactive state.

15. The method of claim 14, wherein coupling the predetermined voltage to the inter-node latch includes coupling a ground voltage to the inter-latch node via a first switch when the clock signal is in the inactive state.

16. A system comprising:
a television tuner to receive and process a radio frequency (RF) signal and including:
a mixer to downconvert the RF signal to a second frequency signal;
an analog-to-digital converter (ADC) to receive and digitize the second frequency signal, the ADC including:
a combiner to combine the second frequency signal with an error signal to obtain a combined signal;
a loop filter to filter the combined signal;
a quantizer to generate and output a digitized signal from the combined signal;
a mismatch shaper circuit coupled to the quantizer to mismatch shape the digitized signal; and
a feedback digital-to-analog converter (DAC) coupled to receive the mismatch shaped digitized signal and generate the error signal, the feedback DAC including a plurality of latch circuits each including a reset circuit to maintain an inter-latch node of the latch circuit at a predetermined voltage level when a clock signal provided to the latch circuit is inactive.

17. The system of claim 16, wherein the feedback DAC further comprises a plurality of switching cells each coupled to an output of one of the plurality of latch circuits and to switch an output signal of the latch circuit to a summation node.

18. The system of claim 16, wherein the mismatch shaper circuit is to shuffle a plurality of bits of the digitized signal to obtain mismatch shaped digitized signals.

19. The system of claim 16, wherein each of the plurality of the latch circuits includes:
a first input to receive a data bit and a second input to receive the clock signal, the latch circuit including a first transistor gated by the data signal a second transistor gated by the clock signal, the first transistor coupled to the second transistor at the inter-latch node; and
the reset circuit to maintain the inter-latch node at the predetermined voltage level when the clock signal provided to the latch circuit is inactive.

20. The system of claim 16, wherein the reset circuit includes a first switch coupled to the inter-latch node.

21. The system of claim 20, wherein the first switch is coupled to receive an inverted clock signal.

* * * * *